United States Patent [19]

Hoshi et al.

[11] 4,127,969
[45] Dec. 5, 1978

[54] METHOD OF MAKING A SEMICONDUCTOR WAFER

[75] Inventors: Kinji Hoshi, Sagomichoro; Kazuhiro Sugita, Yokohama, both of Japan

[73] Assignee: Sony Corporation, Tokyo, Japan

[21] Appl. No.: 639,806

[22] Filed: Dec. 11, 1975

Related U.S. Application Data

[62] Division of Ser. No. 178,732, Sep. 8, 1971, abandoned.

[30] Foreign Application Priority Data

Sep. 8, 1970 [JP] Japan .................................. 45-78583
Sep. 8, 1970 [JP] Japan .................................. 45-96065
Feb. 5, 1971 [JP] Japan .................................. 46-4885

[51] Int. Cl.² ............................................. B24B 1/00
[52] U.S. Cl. .............................. 51/283 R; 51/59 SS;
51/290
[58] Field of Search ............... 51/283, 290, 59 SS; 93/80; 29/583

[56] References Cited

U.S. PATENT DOCUMENTS

| 3,078,549 | 2/1963 | Wende | 51/283 X |
| 3,094,026 | 6/1963 | Pottle | 93/80 X |
| 3,124,868 | 3/1964 | Zacaroli | 29/583 X |
| 3,237,281 | 3/1966 | Antonson | 29/583 X |
| 3,699,719 | 10/1972 | Rozdilsky | 51/59 SS |

*Primary Examiner*—Harold D. Whitehead
*Attorney, Agent, or Firm*—Lewis H. Eslinger; Alvin Sinderbrand

[57] ABSTRACT

Semiconductor wafers with apertures, that may include crystal orientation surfaces, are made by boring semiconductor ingots and slicing the bored ingots perpendicular to the bore or at an angle thereto. Novel means are provided for handling the wafers without scratching the major surfaces thereof, for supporting the slices to clean them, and for supporting the slices to coat the major surfaces.

12 Claims, 19 Drawing Figures

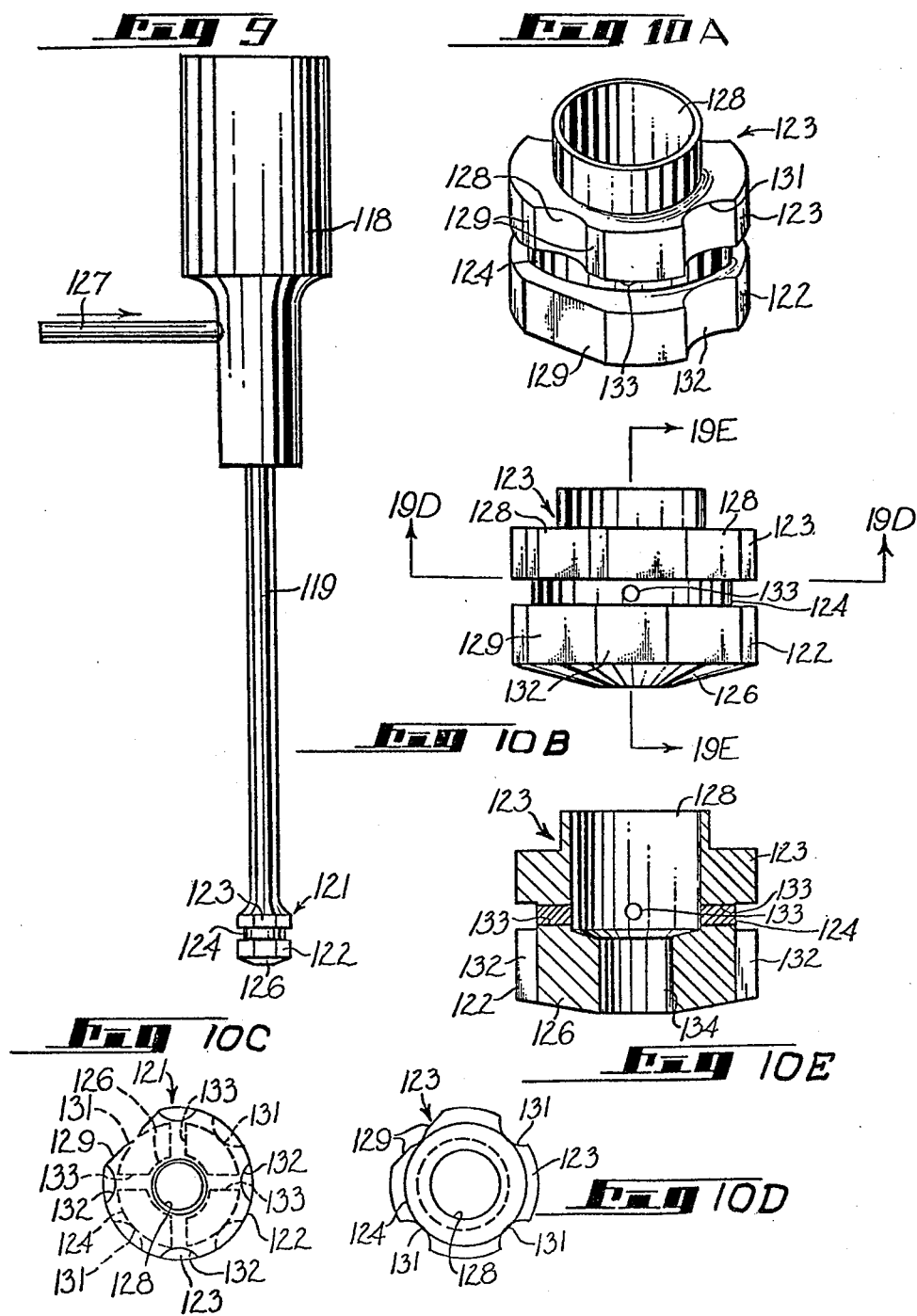

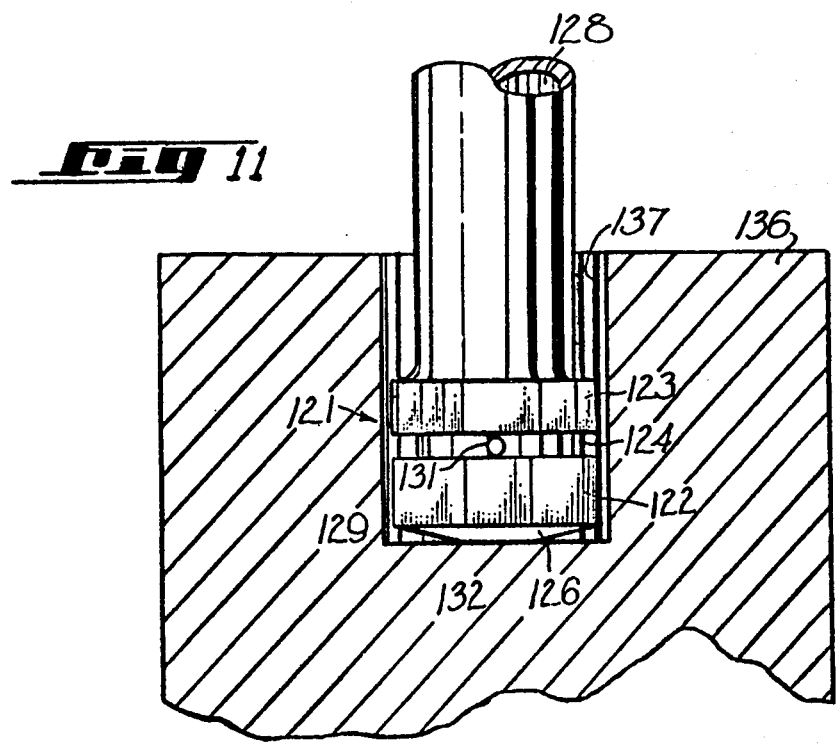
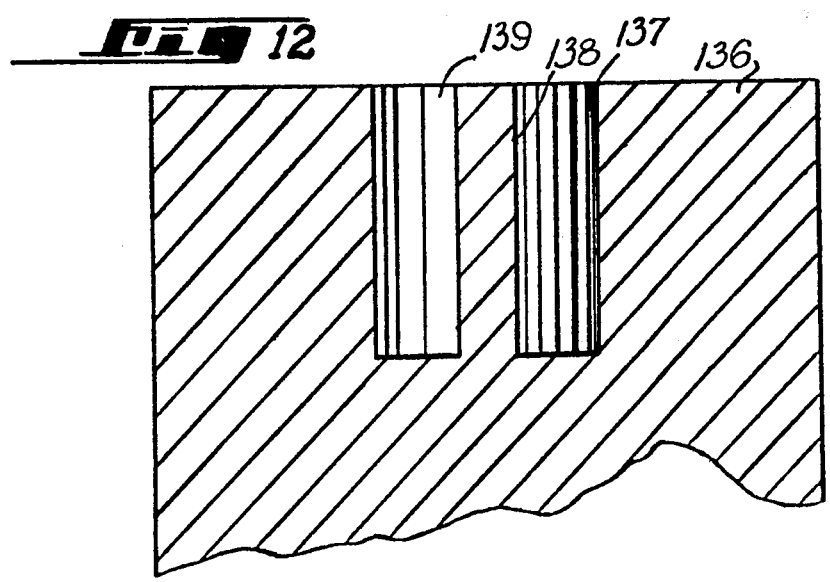

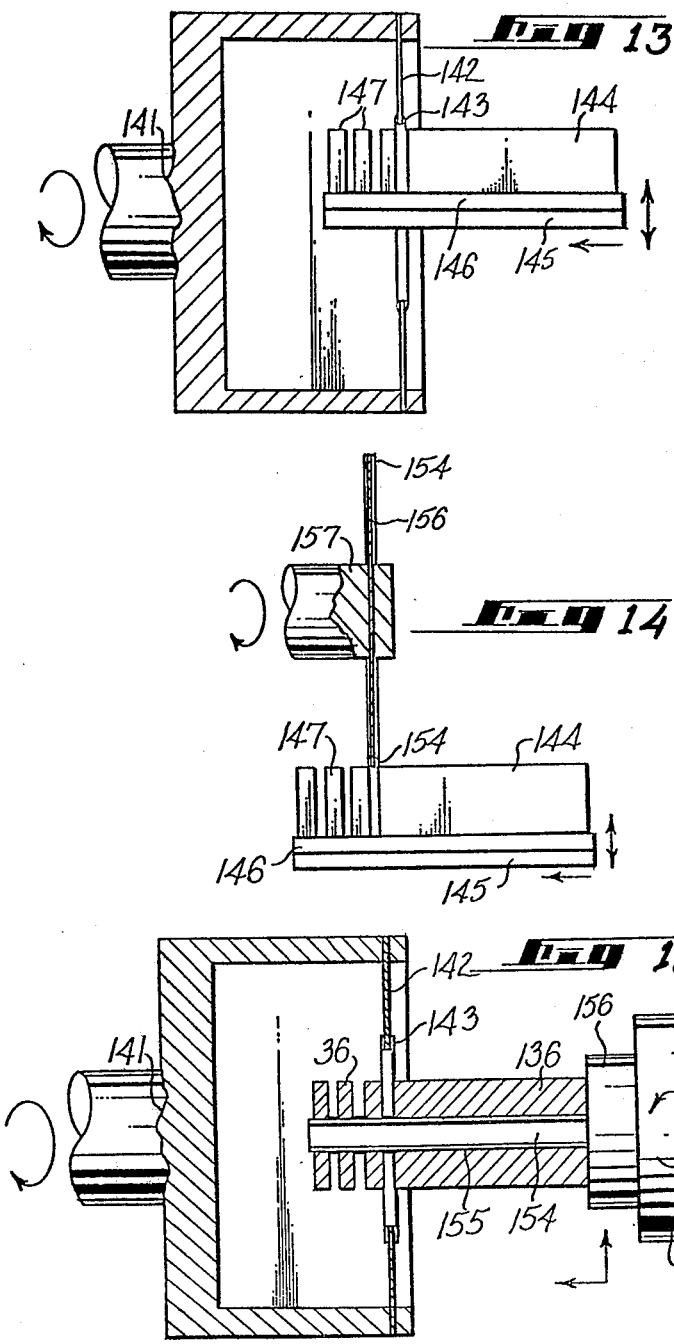

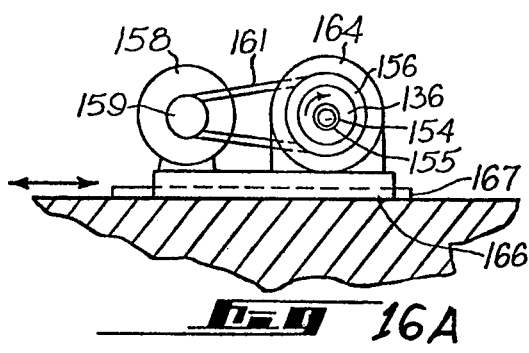
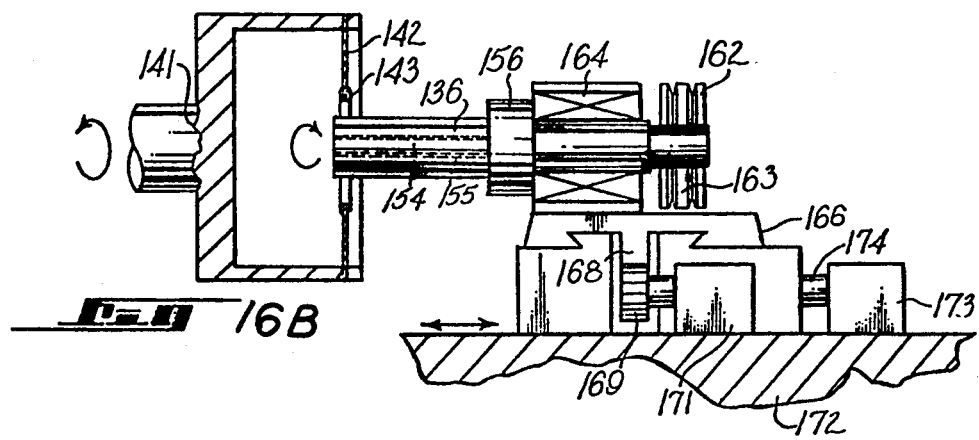
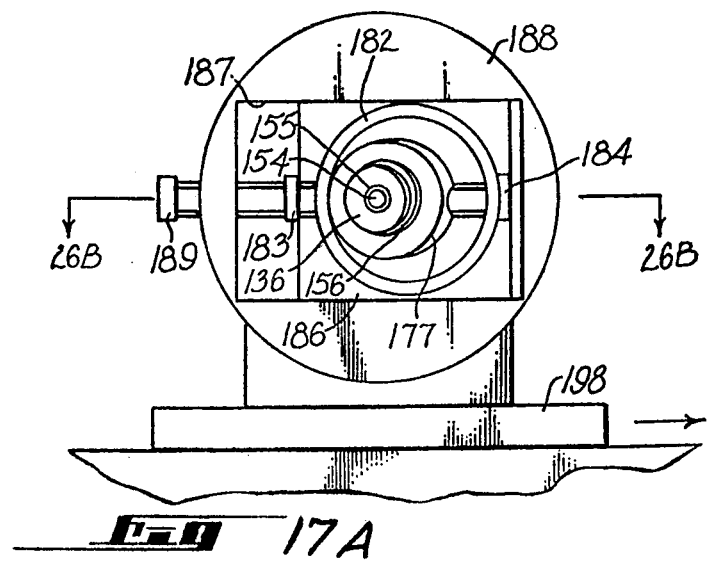

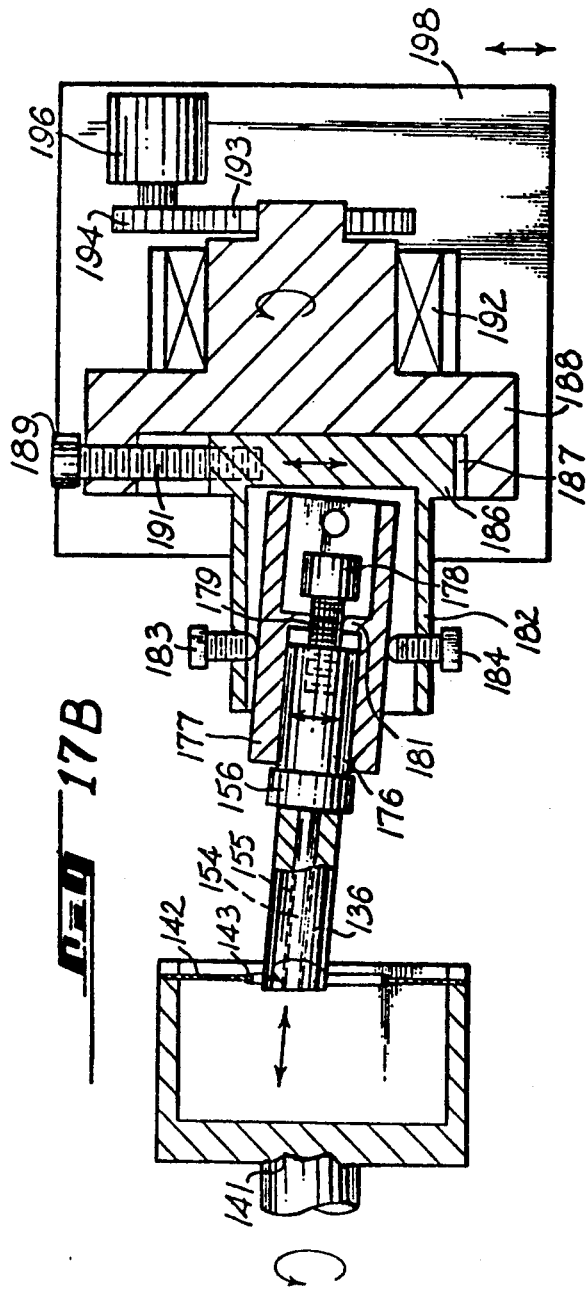
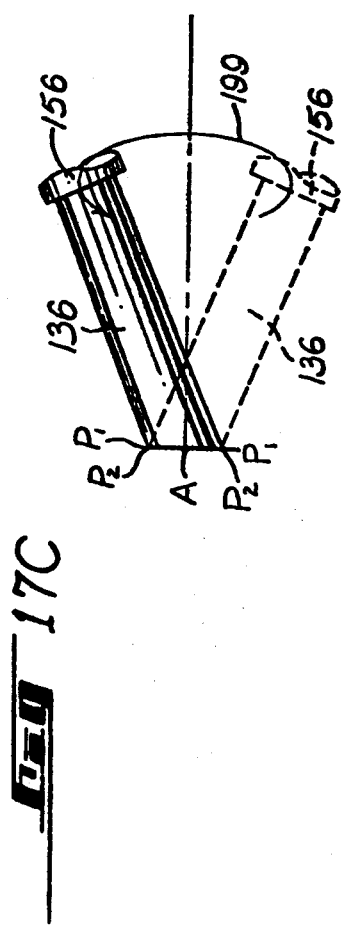
FIG. 17B
FIG. 17C

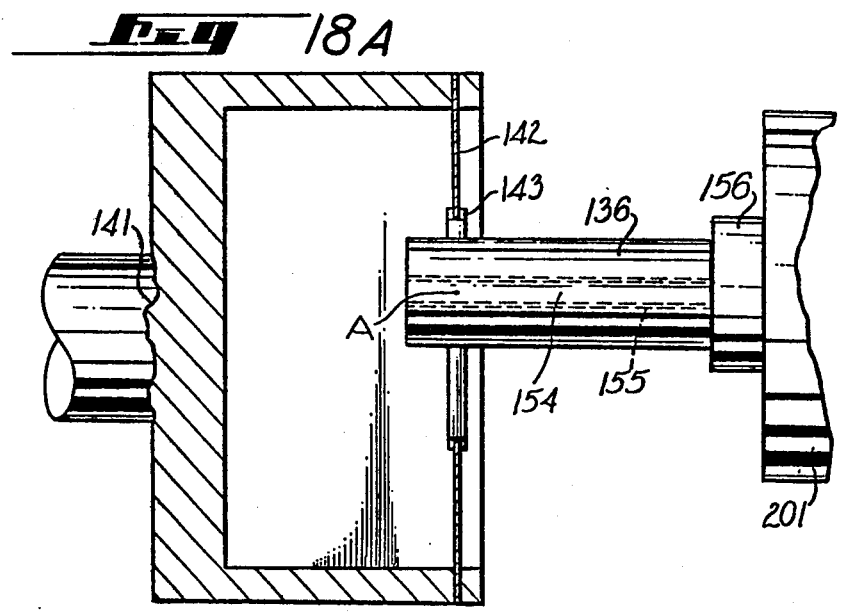
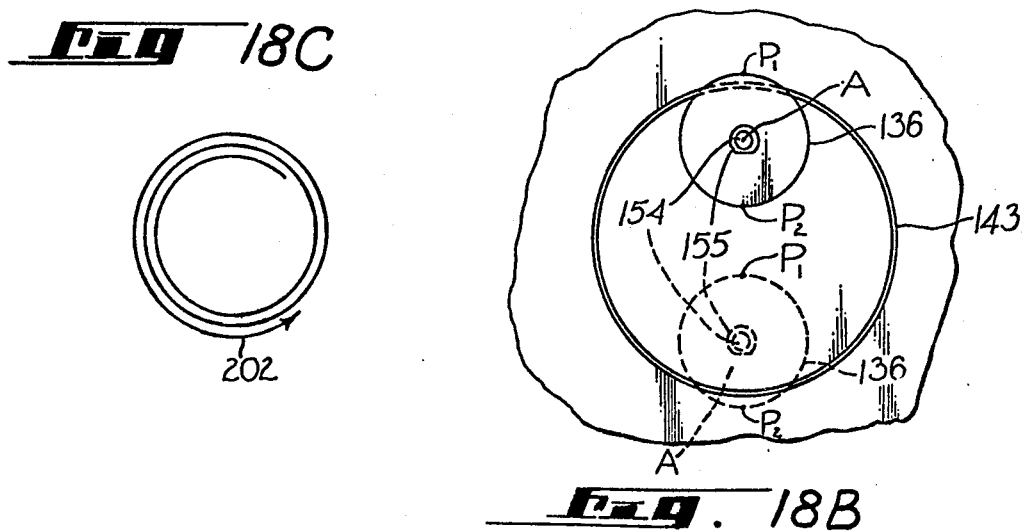

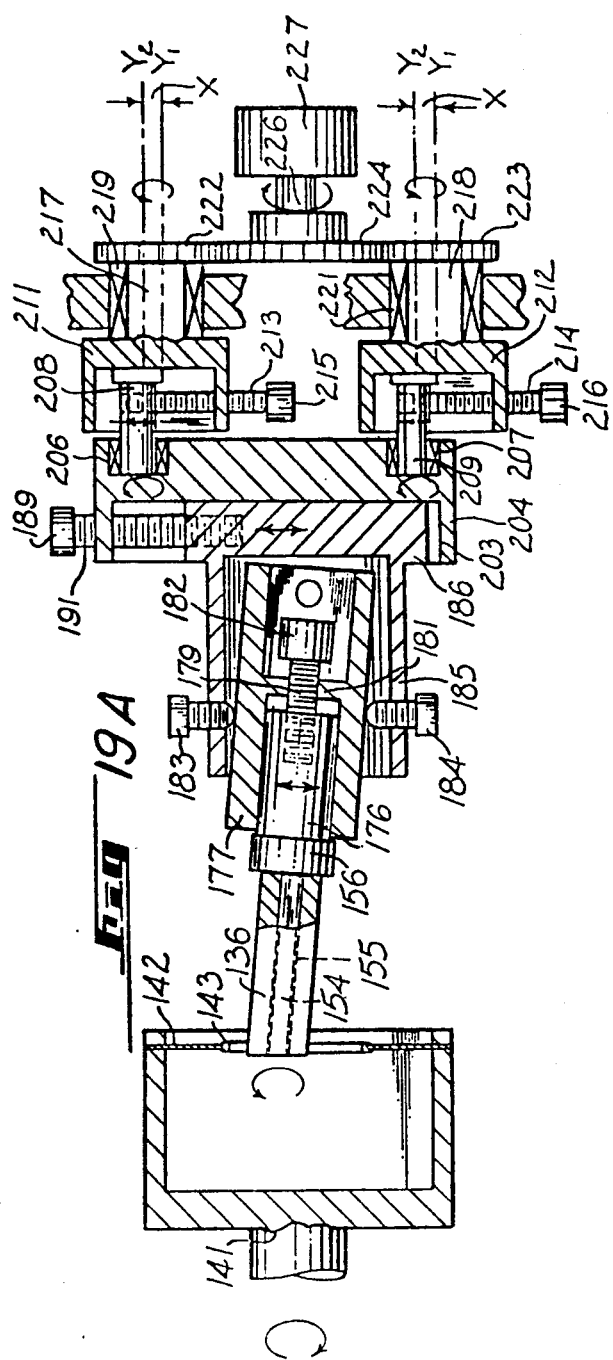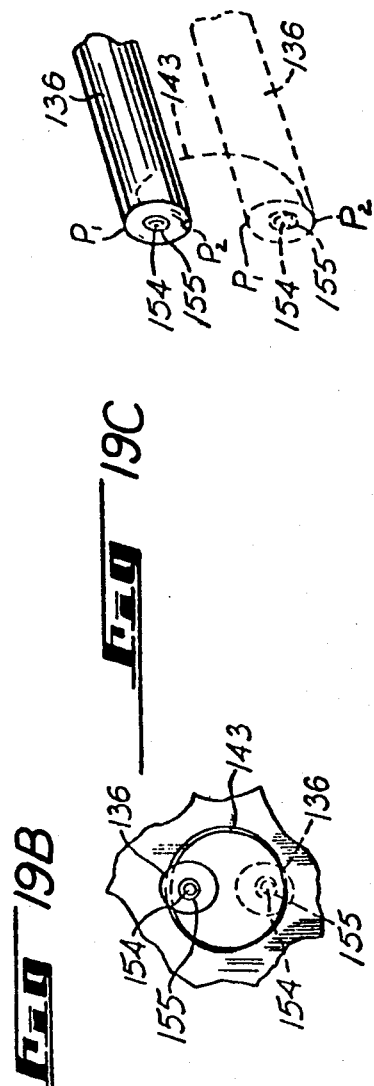
FIG. 19A
FIG. 19B
FIG. 19C

METHOD OF MAKING A SEMICONDUCTOR WAFER

This is a division of application Ser. No. 178,732, filed Sept. 8, 1971, and now abandoned.

BACKGROUND OF THE INVENTION

1. Field of the Invention

This invention relates to semiconductor wafers with apertures to facilitate handling and to processes for forming and handling such wafers.

2. The Prior Art

Semiconductor wafers cut from large ingots are usually circular or elliptical. A small segment may be removed from one part of the circular edge corresponding to a predetermined crystallographic orientation. These wafers are the basic structures, or substrates, for manufacturing a wide variety of semiconductor devices, including diodes, transistors, integrated circuits, and the like. The manufacture of any of these devices comprises a number of steps, some more than others, and between each step and the next the wafer usually needs to be moved from one place to another, or at least repositioned. The wafers are easily damaged, both physically and by chemical contamination, and the usual means for handling them is a pair of tweezers. In some cases, a single wafer may have to be handled 200 times in the manufacture of a complex integrated circuit device, and with such a large number of repetitions, even the most careful handling may cause surface deterioration of the wafer or cracks in the wafer so as to render at least part of the wafer unusable. Such losses are expensive, for even if the semiconductor material can be salvaged and reprocessed, there is a loss of the time involved in carrying out manufacturing steps on that part of the wafer that later is damaged and cannot be used.

It is one of the objects of the present invention to provide semiconductor wafers that can be easily handled without touching the main surfaces of the wafers.

The novel wafers of this invention are formed by a process that requires boring a semiconductor wafer in such a way as to form a hole of selected cross-sectional shape and axial orientation.

A further object of this invention is to provide an improved process for forming apertured semiconductor wafers and improved means for boring holes in semiconductor ingots.

Heretofore semiconductor wafers have been sliced by disc saws having either internal or external cutting edges. In either case, the cutting edge must move completely through the ingot to make each slice. This requires that the radial distance between the cutting edge and the support means for the blade be at least as great as the diameter of the ingot, and the greater this radial distance, the more flexible the blade of a given thickness. Flexibility is detrimental to accurate cutting.

It is a further object of the present invention to reduce this relative radial movement of the cutting blade and ingot to less than half the diameter of the ingot so that blades having smaller free radial dimensions, and therefore greater rigidity, can be used.

BRIEF DESCRIPTION OF THE INVENTION

A semiconductor wafer is formed by boring a hole in a semiconductor ingot, mounting the ingot on a support rod, and sawing radial cuts to slice off the wafer. The ingot is rotated to allow the cutting edge of the saw to cut into it from all directions. After the wafer has been sliced off, it may be handled by radially compressing the resilient ends of a special tool, inserting the compressed ends into the hole in the wafer, and allowing the ends to spring back out to engage the perimeter of the hole. The resilient ends may have an external groove to interfit with the perimeter in order to keep the wafer from falling off. The hole may be bored by ultrasonic means and thus be of any desired cross-sectional shape. For example, it may be partly round but with a flat section oriented in accordance with the crystallographic structure of the wafer. Or the hole may be polygonal. It may also be bored by electrical discharge.

It is not necessary for the wafers to be sliced perpendicular to the hole bored in the ingot. In accordance with this invention, means may be provided to mount the ingot at an angle to the saw and rotate it in such a way as to saw wafers obliquely instead of perpendicularly.

BRIEF DESCRIPTION OF THE DRAWINGS

FIG. 9 is a side view of a cutting device operated ultrasonically for boring a hole longitudinally in a semiconductor ingot.

FIGS. 10A-10E show, in greater detail, the cutting head of the device in FIG. 9.

FIG. 11 shows the cutting head of the device in FIG. 9 boring a hole in an ingot.

FIG. 12 is a cross-sectional view of the ingot in FIG. 11 after a hole has been bored part of the way through it.

FIGS. 13 and 14 show cross-sectional views of ingot-slicing devices to cut ingots of the prior art.

FIG. 15 is a cross-sectional view of an improved cutting device to cut ingots having longitudinal holes bored in them according to this invention.

FIGS. 16A and 16B are front and cross-sectional side views, respectively, of means for slicing the wafers in FIGS. 2-6 from an ingot.

FIGS. 17A and 17B are front and cross-sectional side views, respectively, of modified means for slicing wafers from an ingot.

FIG. 17C illustrates the motion of the ingot in the mechanism of FIGS. 17A and 17B.

FIG. 18 is a cross-sectional side view of another form of slicing apparatus.

FIG. 18B shows the relative motion of the cutting wheel and the ingot in the apparatus of FIG. 18A.

FIG. 18C represents the relative path of the axis of the ingot and the saw in the apparatus of FIG. 18A.

FIG. 19A is a cross-sectional view of another embodiment of slicing apparatus.

FIG. 19B shows the relative movement of the ingot and cutting edge in the apparatus of FIG. 19A.

FIG. 19C is a perspective view illustrating the relative movement of the ingot and cutting edge of the apparatus in FIG. 19A.

DETAILED DESCRIPTION OF THE INVENTION

Figure 1:
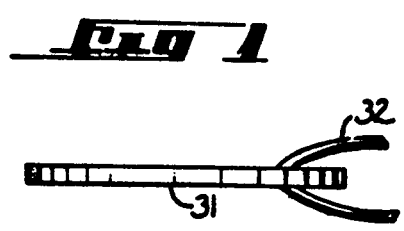
FIG. 1 shows a semiconductor wafer being held by tweezers in accordance with the handling technique used prior to this invention.

FIG. 1 shows a semiconductor wafer 31 held by a pair of tweezers 32, only the gripping ends of which are shown. This is the customary way of handling these wafers as they are moved from one position or location to another in processing them into finished diodes, transistors, integrated circuits, or other semiconductor devices. At least one surface of the wafer is likely to be highly polished or to have materials, such as oxide layers, other semiconductors, or other materials deposited thereon in specific and delicate patterns. In any of these cases, it is important that the surface of the semiconductor not be scratched. A scratch destroys the utility of at least the area directly involved and may have effects that spread over a much wider area. Therefore, semiconductor wafers must be handled as gently as possible but not so gently as to be dropped and totally destroyed. Production personnel involved in manufacturing semiconductor devices become quite adept at handling the wafers, but there are still unavoidable losses of areas of wafers through scratches or cracks.

Figure 2:
FIG. 2 is a perspective view of one embodiment of a semiconductor wafer formed according to the present invention.

FIG. 2 shows a novel semiconductor wafer 33 that is extremely simple and yet can be easily handled without being scratched. Moreover, this novel wafer configuration lends itself to improved manufacturing techniques and apparatus that would have been completely useless for prior semiconductor wafers.

The wafer 33 has at least one aperture 34 therethrough, although it may have an additional hole 35 to indicate crystallographic orientation and to provide certain advantages in manufacturing techniques that would not be possible with a single round hole 34. The wafer 33 is a circular slab cut perpendicular to the axis of a cylindrical ingot of semiconductor material. In the simple embodiment shown in FIG. 2, the aperture 34 is round and is at the center of the wafer 33. Before describing the advantages in handling, processes, and apparatus made possible by the apertured wafer 33, a few of the many possible specific configurations will be described.

Figure 3:
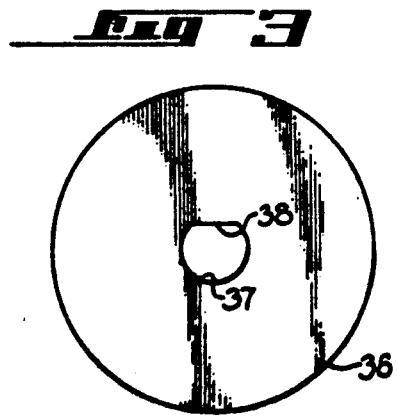

FIG. 3 shows another circular wafer 36, but its center hole 37 has a flat side 38 instead of being perfectly circular. This flat side may be aligned with a particular crystallographic orientation. It is known at the present time to flatten one part of the periphery of a circular semiconductor wafer, such as the wafer 31 in FIG. 1, but material has to be removed in order to create the flat edge.

Figure 4:
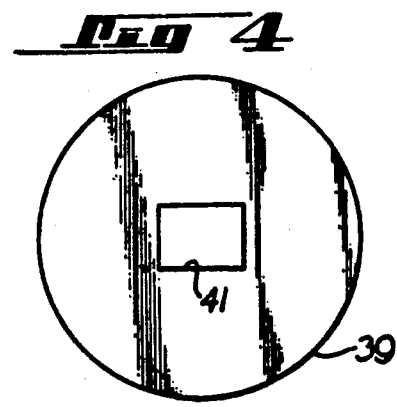
FIGS. 3-6 are plan views of modified forms of the wafer in FIG. 2.

FIG. 4 shows another circular semiconductor wafer 39 with a rectangular central aperture 41. The flat sides of this polygonal aperture result in even greater accuracy in angular orientation of the wafer to conform to its crystallographic structure.

Figure 5:
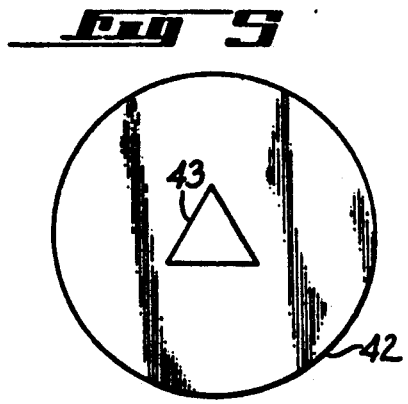

FIG. 5 shows a round wafer 42 with a central aperture in the form of an equilateral triangle 43. The triangle permits a different type of orientation of the wafer than the rectangle 41 in FIG. 4, which allows the wafer to be oriented in only two positions, or the assymmetrical hole 37 in FIG. 3, which restricts the wafer to one position.

Figure 6:
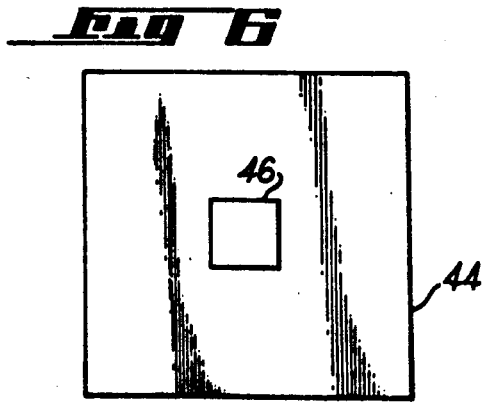

FIG. 6 shows a square wafer 44 with a square hole 46 at the center. Square wafers usually make the most efficient use of semiconductor material since square or rectangular circuits fit on them with the least loss of material, but other polygonal shapes may be used instead.

Whatever its shape, the hole in the semiconductor wafer makes it possible to pick up the wafer without touching the main, or effective, surface thereof. A tool includes a cylindrical body one end of which is divided by at least one slot 48 into two legs 49 and 51. These legs have grooves 52 and 53, respectively, near their free ends to receive the inner perimeter of the holes in the wafers. The other end of the body 47 has a loop 54 to allow the tool to be suspended from a rod or a hook or any other convenient device.

Figure 7:
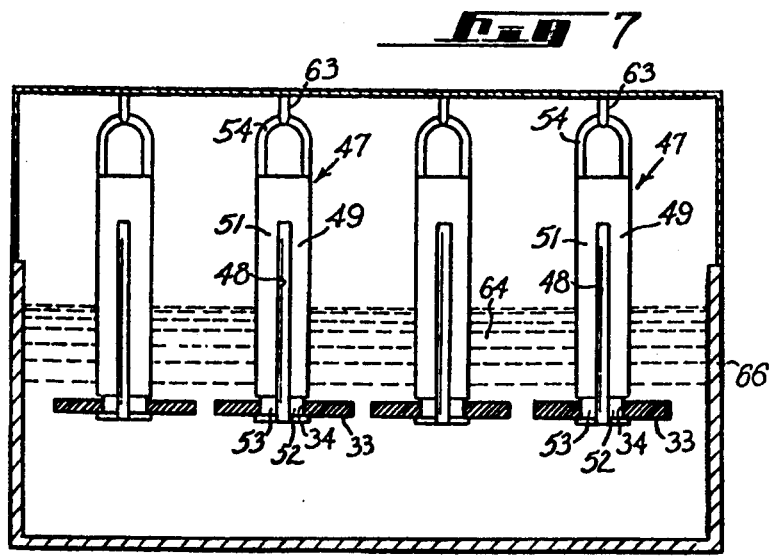
FIG. 7 shows a plurality of holders supporting a group of wafers in a fluid bath.

FIG. 7 shows several tools 47 suspended by their loops 54 from a set of hooks 63 and holding a set of wafers 33 in a washing liquid 64 in a container 66. The latter may include means to cause the liquid 64 to flow past the wafers 33, and their positions are such as not to impede the flow of the liquid in a direction perpendicular to the plane of the drawing. Just as important, or even more so, no part of the tools 47 touches the main surfaces of the wafers, and therefore all parts of these surfaces are easily cleaned. Heat treatment of wafers held via their apertures is also more uniform.

The apertures in the wafers shown in FIGS. 2–6 can be machined by supersonic cutting, electric discharge cutting, sandblast, cutting by charged particles, chemical etching, etc. However, it is preferable from the point of view of mass production to machine a whole ingot of semiconductor material at one time before the ingot is sliced into wafers.

Figure 8:
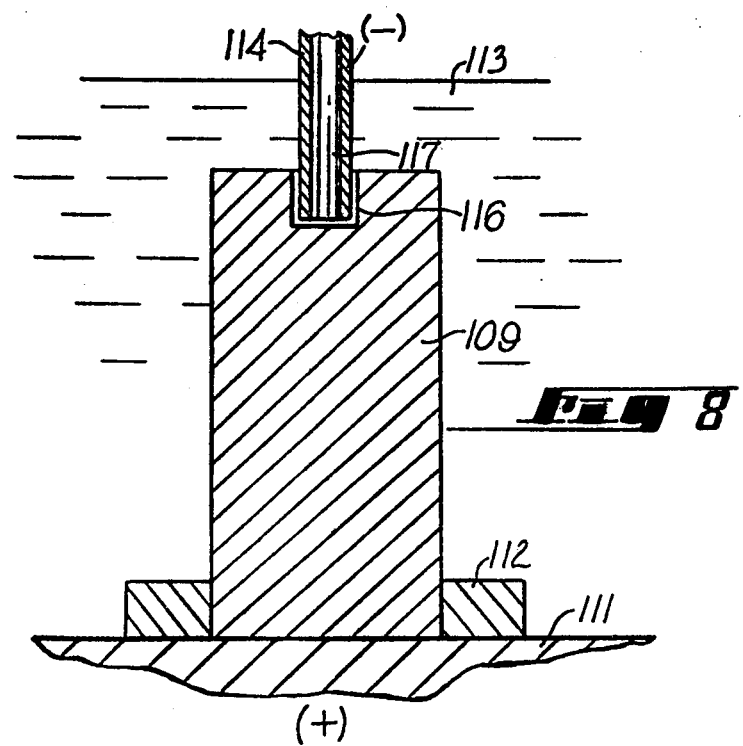
FIG. 8 is a cross-sectional view of an ingot and electric discharge means for boring a hole through it.

FIG. 8 shows a semiconductor ingot 109 resting on an electrode 111 which is connected to the positive pole of an electric discharge power supply and clamped to the positive pole by a holder 112. The ingot and the holder 112 are immersed in oil 113. A hollow negative cutting electrode 114 is brought into close proximity to the upper surface of the ingot 109 to start cutting into the ingot by electric discharge. The electrode 114 may be of metal, such as copper, and it starts to create the cutting discharge when it is within a distance of approximately 0.02mm. from the ingot 109. The voltage difference between the electrode 114 and the electrode 111 is approximately 140 volts and the discharge current is about 20 amps. Material removed from the ingot 109 by the discharge process is drawn up through a central hole 117 in the hollow electrode 114. A 10mm. diameter hole can be bored in a 100mm. long ingot 109 in about 100 minutes. Current and voltage conditions can be varied according to the resistance of the ingot.

FIGS. 9–12 show means for machining a hole in an ingot by ultrasonic wave cutting. This method is especially convenient for boring a deep hole in an ingot.

FIG. 9 shows the cutting mechanism, which includes a vibrator 118 such as a ferrite vibrator or a magnetostriction device or any device suitable for producing vibrations at ultrasonic frequencies. A hollow pipe 119 is connected to the vibrator 118. The pipe 119 is preferably made of stainless steel and has a length of $\lambda/2 \times N$, where $\lambda$ is the wavelength of the ultrasonic wave produced by the vibrator 118 and N is an odd integer. The pipe 119 connected to the vibrator 118 has, at its lower end, a cutting tip 121 comprising two flanges 122 and 123 separated by a groove 124. The lowermost end of the flange and of the cutting tip itself is indicated by reference numeral 126. A supply pipe 127 brings a polishing liquid into the hollow pipe 119 to be dispensed from the tip 121 during the cutting operation. This polishing liquid may be water mixed with a polishing material of Carborundum No. 800. The cutting tip 121 may be made of stainless steel attached to the pipe 119 by silver solder.

The cutting tip is shown in greater detail in FIGS. 10A-10E. As shown particularly in FIG. 10A, the cutting tip has a short cylindrical member 128 by which it is attached to the tip 119. This particular cutting tip is intended to cut the type of aperture indicated in FIG. 3 by reference numeral 37. Most of the perimeter of this aperture is circular, but there is a flat section 38. This flat section is machined by flat sections 129 of the two flanges 122 and 123. In order to allow space for the polishing material to escape from the cutting area, the flange 123 has several longitudinal grooves 131 spaced around it. Similarly, the flange 122 has several longitudinal grooves 132. Between the flanges 122 and 123 and in the groove 124 are several holes 133 through which the polishing material can flow.

FIG. 10B shows a side view of the cutting tip 121 and, in addition to the parts described in connection with FIG. 19A, shows the slightly conical surface 126.

FIG. 10C is a bottom view of the cutting tip indicating the spacing of the grooves 131 and 132. As may be seen, the grooves in the flanges 122 and 123 are angularly offset with respect to each other and have a limited angular extent so that the cutting head cuts a completely circular aperture except for the flat part which is cut by the flat surface 129.

FIG. 10D is a cross-sectional view along the line 10D-10D in FIG. 10B and shows the arrangement of the grooves 131 in the flange 123.

FIG. 10E is a cross-sectional view of the cutting tip 121 along the line 10E-10E in FIG. 10B and shows the arrangement of the openings 133 through which the polishing material can escape the groove 124. This cross-sectional view also illustrates the reduced diameter opening 134 through the bottom 126 of the cutting head. A substantial part of the polishing material escapes through this relatively large opening and assists in the cutting action of the bottom surface of the cutting tip.

One example of the dimension of the cutting tip as shown in FIGS. 10A-10E is as follows:
Total length—10.36mm.
Longitudinal thickness of each flange 122 and 123—3mm.
Depth of the groove 124—1.0mm.
Width of the groove 124—1.5mm.
Diameter of the central hole 130—5mm.
Diameter of the small holes 133—1.2mm.
Radius of each of the grooves 131 and 132—1.2mm.
Radius of the recessed portions at the bottoms of these grooves—1.5mm.
Depth of the recesses 131 and 132—1.0mm.

The cutting head is made of SUS27 stainless steel. It has been found in connection with this cutting tip that if the longitudinal thickness of the flanges 122 and 123 is substantially greater than 3mm., the head does not cut the ingot to make a hole therein because of the friction between the flanges and the ingot. However, if the thickness of these flanges is substantially less than 3mm., the cutting tip wears quickly and does not work well. The range of thickness of these flanges is preferably 2-5mm.

FIG. 11 shows the cutting tip 121 in operation on an ingot 136. The cutting tip has bored partway into the ingot to produce a hole having a surface 137. The tip 121 is caused to vibrate longitudinally and is directed into the ingot 136 while the polishing liquid is fed into the opening 130 of the hollow pipe 119. The polishing liquid emerges through the holes 133 and through the large bottom opening 134. The polishing liquid contributes to cutting the hole in the ingot, and as it emerges from the holes 133 and the opening 134, it carries the cutting dust up through the recesses 132 and 131. New polishing liquid is always being supplied to the cutting tip 121 and the old polishing liquid drained away regardless of the depth of the hole 137. This operation not only bores a hole very rapidly in the ingot but also makes it possible to bore a hole that is not round, and in fact may have any configuration, depending on the configuration of the flanges 122 and 123.

Due to the fact that the tip 121 has a central opening 134 that connects with the hollow interior of the pipe 119, the boring operation not only produces a hole defined by the surface 137 but also leaves a circular central column 138 as shown in FIG. 12. The material removed from the ingot 136 leaves a cylindrical space 139. The central column 138 may be used later in the apparatus that slices the ingot into wafers.

Typical conditions for ultrasonically boring a hole in the ingot 136 by means of a ferrite vibrator are as follows:
Vibrating frequency—21KHz
Current to the vibrator—0.3 amps
Polishing liquid flow—0.5 liters per minute
Polishing liquid composition—1 unit of Carborundum No. 800 to 3 units of water
Cutting speed—25mm. per hour.

FIGS. 13 and 14 show typical prior art wafer slicing machines. In FIG. 13, a rotating holder 141 has a thin metal disc 142 supported near its outer end. The disc 142 has a central aperture coated with a layer of diamonds 143 to act as the saw, or cutting medium, for slicing semiconductor materials.

An ingot 144 of semiconductor material is affixed to a support plate 145 by a layer of wax 146. As indicated by the arrow, the support plate with the ingot on it is capable of moving both longitudinally and vertically in order to bring the ingot 144 into contact with the diamond-edged blade 142. The motion of the plate 145 is controlled so that it moves forward a specific distance each time a slice is to be made, and in this way a series of identical plates 147 is formed from the semiconductor material.

During the cutting operation, the holder 141 rotates at a speed of about 7,000 rpm, and the longitudinal motion of the plate with the ingot 144 is stopped while a cut is being made. The radial dimension of the blade 142 between the cutting edge 143 and the inner surface of the holder 141 must be large enough to allow the cut to go completely through the ingot 144. If the ingot is in the form of a circular cylinder, this radial dimension must be at least as great as, and actually slightly greater than, the diameter of the cylinder.

An alternative wafer-slicing apparatus is shown in FIG. 14 in which the cutting blade has an external cutting surface rather than an internal one. In this case, the ingot 144 is the same as in FIG. 13 and is mounted on a plate 145 by a layer of wax 146. The cutting blade slices it into plates 147 which normally are polished into wafers, such as the wafer 31 in FIG. 1. The actual cutting is accomplished by rotation of a shaft 151 which rotates a thin blade 152, the edge of which has a thin layer of diamonds 153 thereon. A typical thickness for the disc 152 is from about 0.1–1.0mm.

There are two primary defects in the conventional slicing machines shown in FIGS. 13 and 14. One is that when the radius of the cutting wheel 142 or 152 is increased to slice a larger ingot, the stiffness of the wheel is reduced. Since the wheel may have a thickness of as little as 0.1mm., any reduction in stiffness may cause a reduction in cutting accuracy, which is most undesirable. The second problem is the increase of cutting resistance between the ingot 144 and the diamond cutting edge when a larger diameter ingot is to be sliced.

These defects in the prior art designs of slicing machines frequently cause the cutting wheels to begin to vibrate and thereby destroy themselves. If the blades do not actually vibrate enough to be destroyed, they may slice the wafers with surfaces that are not flat and parallel, and this is also undesirable.

FIG. 15 shows a slicing machine arranged to accommodate the bored ingot 136. The left hand portion of this machine is similar to that shown in FIG. 13 and includes a rotating shaft driving a holder 141, which is in the form of a hollow cylinder. The saw, or cutting wheel, 142 is attached to the open end of the holder 141 and has the same diamond cutting edge 143 as the machine in FIG. 13.

The ingot 136, which, in this embodiment, may be understood as having been bored by the cutting tip 121 in FIG. 10A, is mounted on a central column 154 by means of a layer of wax 155. In actual practice, it may be desirable to use the column 138 shown in FIG. 12 as the mounting cylinder 154 for the ingot 136. In any case, the ingot and its cylinder are attached to a chuck 156 connected to a rotator 157 which may be part of a lathe especially adapted to be used for slicing semiconductors. The chuck 156 can move in two directions, as indicated by the arrows below it, in addition to rotating as indicated by the arrow in the rotator 157. The direction of rotation of the rotator 157 and the ingot 136 attached thereto is preferably opposite to the direction of rotation of the holder 141 indicated by the arrow to the left.

When the ingot 136 is to be sliced, it is moved longitudinally to a specified point and then is moved vertically to bring it into contact with the cutting edge 143. The ingot rotates against the cutting edge, and this rotation alone would be sufficient to cut a slice from the end of the ingot 136. Such a slice becomes a wafer 36 of the type shown in FIG. 3. However, cutting is not done by rotation of the ingot alone. The opposing rotation of the cutting edge 143 also helps the slicing operation.

It is important to note that the relative vertical movement between the cutting edge 143 and the ingot 136 only need be enough to cause the cutting edge to move somewhat less than halfway through the ingot, since the ingot is held at its center by the column 154 instead of being held on one side. As a result, the radial dimension of the blade 142 from the cutting edge 143 to the inner surface of the holder 141 need only be great enough to allow the cutting edge to go halfway through the ingot 136 instead of all of the way through. This makes it possible to cut an ingot of a given diameter with a much smaller and, therefore, much more rigid blade than would have to be used by the prior art machines. In addition, the cutting resistance due to the interaction between the ingot 136 and the cutting edge 143 is reduced almost to half of the value experienced in the prior art apparatus shown in FIG. 13. As a result, there is little or no vibration or bending of the wheel 142 to cause cracks or bending of the wafers 136.

FIGS. 16A and 16B show more details of the apparatus for rotating the ingot 136 in FIG. 15. This apparatus includes drive means in the form of a motor 158 that turns a V-belt drive pulley 159. A V-belt 161 engages the pulley 159 as well as a driven pulley 162 on a shaft 163. The shaft 163 is supported in a bearing 164 mounted on a table 166 that can be moved back and forth on a guide 167 as indicated by the double-ended arrow in FIG. 25A. The table has a rack 168 that meshes with a pinion 169 driven by a motor 171 to move the entire table 166 back and forth to make slices in the ingot 136. The support 167 rests on another support 172 and is capable of moving back and forth thereon in the direction indicated by the double-ended arrow in FIG. 16B under the control of a motor 173 that operates a lead screw 174. The position of the support 167 in response to operation of the lead screw 174 determines the location of the cut in the ingot 136 and the movement between successive cuts determines the thickness of the wafers sliced from the ingot.

Sometimes it is desirable to slice an ingot at an angle to its axis. One reason for doing so is that the crystallographic structure of the ingot may be such that one of the axes of the crystal is slightly askew with respect to the machined axis of the ingot. In that case, slices may need to be made at an angle to the axis of the ingot and this angle may be quite small, for example 1° or 2°. However, the size of the angle is not limited to such small values. Another reason for slicing an ingot at an angle is the desire to obtain wafers having relatively large areas. An elliptical wafer cut from a round ingot of given diameter is, of course, larger than a circular wafer cut from the same ingot. The same thing holds true for polygonal wafers.

FIGS. 17A and 17B show one embodiment of an apparatus for slicing ingots obliquely. The cutting portion of the mechanism is the same as that shown in FIG. 2 and includes the support 141 for the blade 142 having a cutting edge 143. The support 141 rotates on its axis to rotate the cutting edge 143. The ingot 136 is held in the chuck 156 which, in this apparatus, is attached to a cylinder 176 held within another cylinder 177 and free to move longitudinally with respect to the latter cylinder. This longitudinal motion is controlled by a motor 178 acting through a feed screw 179, which is connected to the cylinder 176 to move it longitudinally but not to rotate it. The screw 179 is threaded through a transverse plate 181 within the cylinder 177.

The cylinder 177 is mounted within yet another cylinder 182 and can pivot up and down to a limited extent within that cylinder about a pivot point B. This pivoting motion is indicated by the double-ended arrow in the cylinder 176. In order to fix the cylinder 177 and, therefore, the ingot 136 in one angular position with respect to the pivot point B, two set screws 183 and 184 are threaded into the cylinder 182 to press against the inner cylinder 177.

The cylinder 182 is attached to a support slide 186 that moves within a groove 187 in a rotatable support 188. A motor 189 rotates a screw 191 that engages the slide 186 and controls its position within the groove 187.

The support 188 is mounted in a bearing 192 and has a gear 193 attached to it to produce rotation as indicated by the arrow in the support 188. The gear 193, in turn, meshes with another gear 194 driven by a motor 196 that furnishes the power for rotating the support 188.

The motor 196 and the support 188 together with the other components connected thereto are all attached to a table 198 capable of moving vertically upward or downward.

When it is desired to cut an oblique slice from the ingot 136, the angle of the cut is set by positioning the screws 183 and 184. The location of the cut longitudinally along the ingot 136 can be set by moving either the support 141 to the left or right or moving the table 198 to the left or right, but in any case, the axis of the ingot 136 should intersect the axis of the support 141 and the cutting blade 142 in the plane of the cutting blade, as indicated at the point A.

When the support 188 rotates, it causes the ingot 136 to rotate as is illustrated in FIG. 17C. Because the ingot does not turn with respect to the support 188, its end surface always remains in one plane, which is oblique to the axis of the ingot. The point A is at the center of the ingot and is the point about which the ingot rotates. As the ingot rotates, the chuck 156 follows a circular path 199. When the ingot is in the upper position indicated in solid lines, the uppermost point in its end face is the point $P_1$, and its lowermost point is the point $P_2$. When the ingot 136 is rotated to the diametrically opposite position indicated in broken lines, the two points $P_1$ and $P_2$ reverse their position, but they still remain in the same plane, which is perpendicular to the axis of the cutting edge 143. The advantage of having to cut only halfway through the ingot 136 holds true for making oblique cuts as well as for making the perpendicular cuts described in connection with FIG. 15.

FIG. 18A shows an apparatus having a different type of movement than the apparatus in FIG. 15 but similar to the former apparatus in many ways. The apparatus in FIG. 28A comprises the same rotatable support 141 to which the cutting blade 142 is attached. The cutting edge 143 is formed facing the central region of the blade 142 and, as a result, the blade has an annular shape. The ingot 136 is mounted in the chuck 156 by means of the layer of wax 155 that attaches the ingot to the central support rod 154. The chuck 156 is supported in a rotating device 201 that causes the ingot 136 not only to rotate about its own axis A but also causes the axis A to follow a spiral path as the ingot feeds into the cutting edge 143.

The relative motion of the ingot and the cutting edge is shown in FIG. 28B. In this figure, the ingot is shown in full lines as it would appear near the top of the cutting edge 143 after a cut had been made approximately one-fourth the necessary distance to form a wafer. At the bottom, the ingot is shown in broken lines as it would appear at a later stage of the slicing process. It will be noted that the ingot is rotating counterclockwise and the cutting edge 143 may be rotated clockwise to increase the relative speed of cutting. As the edge 143 cuts more and more deeply into the ingot 136, the ingot must move outwardly, and since it is also rotating, this outward motion will cause the axis A to follow an outwardly spiral path 202 indicated in FIG. 28C. Alternatively, the position of the axis A of the ingot can be held constant by the rotating means 201 and the position of the axis of the support 141 may be moved to keep the cutting edge pressing against the wafer 136 as a slice is cut. In this case, the axis of the support 141 would also follow a spiral path similar to the spiral path 202 but in the reverse direction.

The mechanism in FIG. 27A required the ingot 136 to rotate within a relatively massive support structure. FIG. 19A shows a different support structure for cutting the ingot 136 at an oblique angle but without requiring the ingot to be rotated about an axis in the manner shown in FIG. 27A. In the apparatus in FIG. 19A, the angular position of the ingot 136 always remains constant, for example in the position shown, but the ingot does follow a generally circular path such that its axis is a generator of a cylinder. More precisely, the ingot follows the type of spiral path illustrated in FIG. 18C, but it follows this path with the axis of the ingot tilted at an angle to the horizontal.

The apparatus in FIG. 19A comprises the support 141 for the cutting blade 142 having the cutting edge 143. As in the case of the apparatus shown in FIG. 17A, the ingot 136 is mounted on the central support rod 154 by means of the layer of wax 155 and is attached to the chuck 156. The latter is mounted on the rod 176 in the cylinder 177 and moved longitudinally with respect thereto by the feed screw 179 controlled by the motor 182. The feed screw is supported in the transverse plate 181 and the cylinder 177 pivots about the point B and is held at any desired offset angle by the screws 183 and 184. The latter are threaded into the cylinder 185 attached to the sliding support member 186 in a slot 203. The slot 203 is located in another support 204 and moves transversely with respect thereto under the control of the motor 189, which is connected to the feed screw 191.

The support 204 has two bearings 206 and 207 into which two shafts 208 and 209, respectively, are fitted. These shafts are slidably mounted in a pair of secondary support members 211 and 212. The shafts 208 and 209 can be moved with respect to the secondary support members by means of lead screws 213 and 214 operated by motors 215 and 216, respectively.

The secondary support members 211 and 212 have shafts 217 and 218 attached to them and supported in bearings 219 and 221. The shaft 217 has a gear 222 attached to it, and the shaft 218 has a gear 223 attached to it and both of these gears mesh with a gear 224 driven by a shaft 226 of a motor 227.

The gears 222 and 223 are always in mesh with the gear 224 and, therefore, the shafts 217 and 218 are at a fixed distance apart. As the gear 224 rotates, these shafts also rotate in the same direction with respect to each other and in the opposite direction with respect to the shaft 226. This causes the supports 211 and 212 to rotate about the axes of the shafts 217 and 218. The supports 211 and 212 are, in effect, crank arms, and the shafts 208 and 209 are, in effect, crank pins. The location of the axes of the shafts 217 and 218 is indicated as $Y_1$ and the location of the axes of the shafts 208 and 209 is indicated as $Y_2$. The distance X between $Y_2$ and $Y_1$ is the amount of offset of the crank pins, and this distance must be changed by operation of the motors 215 and 216 in unison as the edge 143 cuts into the ingot 136. The motors must be connected to operate synchronously.

The constraint due to having two crank pins 208 and 209 engage the support 210 causes each point of this support to move in a circular path having a radius X but prevents the support 210 from pivoting about any fixed axis. If it starts out upright, as shown, it will always remain so. On the other hand, the supports 211 and 212 do rotate.

The motion of ingot 136 is shown in FIGS. 19B and 19C. As indicated, a point $P_1$ at the top of the ingot remains at the top, whether the ingot is against the upper part of the opening defined by the cutting edge 143 or the lower part. The ingot, as stated before, does not rotate but presses against the cutting edge 143 with a scrubbing motion as the edge cuts off a wafer shown in FIG. 19B as having an elliptical shape.

What is claimed is:

1. The method of making a semi-conductor wafer, said method comprising the steps of:

mounting on a rod a semi-conductor ingot having a longitudinal hole extending at least part way longitudinally through said ingot;

temporarily adherently joining said ingot to said rod to form a unitary structure without slippage between said ingot and said rod;

providing relative rotation between said unitary structure and a cutting edge to slice said ingot through to said hole from all radial directions to form a wafer having smooth surfaces, said wafer still being adherently attached to said rod after both main surfaces of said wafer have been formed by such slicing; and subsequently removing said wafer from said rod.

2. The method of claim 1 in which said hole is formed by machining a longitudinal bore entirely through said ingot.

3. The method of claim 1 in which said hold is formed in line with the central axis of said ingot.

4. The method of claim 2 in which said bore is machined to have at least one flat surface in its periphery aligned with a known crystallographic orientation of said ingot.

5. The method of claim 2 in which said hole is machined in alignment with the central axis of said ingot.

6. The method of claim 2 in which both said cutting edge and said ingot are rotated.

7. The method of claim 6 in which said cutting edge and said ingot are rotated in opposite directions.

8. The method of claim 2 in which said cutting edge is circular and is rotated on a fixed axis and said ingot is moved parallel to its own axis along a spiral path.

9. The method of claim 8 in which said axis of said cutting edge is at an angle to the axis of said ingot.

10. The method of claim 8 in which said ingot is held in a fixed orientation with respect to its own axis.

11. The method of claim 2 in which said cutting edge is circular and said ingot is mounted at an angle to the axis of said cutting edge and is rotated with respect to said axis of said cutting edge.

12. The method of claim 11 in which the axis of said ingot is at an angle to the axis of said cutting edge and intersects said axis of said cutting edge.

* * * * *